(12) United States Patent
Pagaila

(10) Patent No.: US 8,466,544 B2
(45) Date of Patent: Jun. 18, 2013

(54) SEMICONDUCTOR DEVICE AND METHOD OF FORMING INTERPOSER AND OPPOSING BUILD-UP INTERCONNECT STRUCTURE WITH CONNECTING CONDUCTIVE TMV FOR ELECTRICAL INTERCONNECT OF FO-WLCSP

(75) Inventor: Reza A. Pagaila, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 70 days.

(21) Appl. No.: 13/035,669

(22) Filed: Feb. 25, 2011

(65) Prior Publication Data

US 2012/0217645 A1     Aug. 30, 2012

(51) Int. Cl.
*H01L 23/485* (2006.01)
*H01L 21/56* (2006.01)

(52) U.S. Cl.
USPC .... 257/686; 257/777; 257/785; 257/E21.499; 257/E21.511; 257/E21.516; 438/106; 438/109; 438/110; 438/127

(58) Field of Classification Search
USPC .......... 257/686, 777, 785, E21.499, E21.511, 257/E21.516; 438/106, 109, 110, 127
See application file for complete search history.

(56) References Cited

U.S. PATENT DOCUMENTS

| | | | |
|---|---|---|---|
| 7,687,899 B1 | 3/2010 | Berry | |
| 2007/0181989 A1 | 8/2007 | Corisis et al. | |
| 2008/0316714 A1* | 12/2008 | Eichelberger et al. | 361/728 |
| 2009/0236752 A1 | 9/2009 | Lee et al. | |

* cited by examiner

*Primary Examiner* — Peniel M Gumedzoe
(74) *Attorney, Agent, or Firm* — Robert D. Atkins; Patent Law Group: Atkins & Associates, P.C.

(57) ABSTRACT

A semiconductor device has a substrate with a plurality of conductive vias and conductive layer formed over the substrate. A semiconductor die is mounted over a carrier. The substrate is mounted to the semiconductor die opposite the carrier. An encapsulant is deposited between the substrate and carrier around the semiconductor die. A plurality of conductive TMVs is formed through the substrate and encapsulant. The conductive TMVs protrude from the encapsulant to aid with alignment of the interconnect structure. The conductive TMVs are electrically connected to the conductive layer and conductive vias. The carrier is removed and an interconnect structure is formed over a surface of the encapsulant and semiconductor die opposite the substrate. The interconnect structure is electrically connected to the conductive TMVs. A plurality of semiconductor devices can be stacked and electrically connected through the substrate, conductive TMVs, and interconnect structure.

23 Claims, 11 Drawing Sheets

SEMICONDUCTOR DEVICE AND METHOD OF FORMING INTERPOSER AND OPPOSING BUILD-UP INTERCONNECT STRUCTURE WITH CONNECTING CONDUCTIVE TMV FOR ELECTRICAL INTERCONNECT OF FO-WLCSP

FIELD OF THE INVENTION

The present invention relates in general to semiconductor devices and, more particularly, to a semiconductor device and method of forming an interposer and opposing build-up interconnect structure with connecting conductive TMVs for electrical interconnect of a Fo-WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (Fo-WLCSP), a semiconductor die is typically enclosed by an encapsulant. A top and bottom build-up interconnect structure are formed over opposite surfaces of the encapsulant for electrical interconnect, e.g. when stacking the Fo-WLCSPs. Each build-up interconnect structure requires formation of a redistribution layer (RDL) involving complex, expensive, and time-consuming manufacturing steps, such as lithography, etching, and metal deposition.

SUMMARY OF THE INVENTION

A need exists for a simple and cost effective electrical interconnect for stackable Fo-WLCSPs. Accordingly, in one embodiment, the present invention is a method of making a semiconductor device comprising the steps of providing a substrate having a plurality of first conductive vias formed through the substrate and first conductive layer formed over the substrate, providing a carrier, mounting a semiconductor die over the carrier, mounting the substrate to the semiconductor die opposite the carrier, depositing an encapsulant between the substrate and carrier around the semiconductor die, and forming a plurality of second conductive vias through the substrate and encapsulant. The second conductive vias are electrically connected to the first conductive layer and first conductive vias. The method further includes the steps of removing the carrier, and forming an interconnect structure over a surface of the encapsulant and semiconductor die opposite the substrate. The interconnect structure is electrically connected to the second conductive vias.

In another embodiment, the present invention is a method of making a semiconductor device comprising the steps of providing a substrate having a conductive path through the substrate, providing a semiconductor die, mounting the substrate to the semiconductor die, depositing an encapsulant around the semiconductor die, forming a plurality of conductive vias through the substrate and encapsulant, and forming an interconnect structure over a surface of the encapsulant and semiconductor die opposite the substrate. The conductive vias are electrically connected to the conductive path through the substrate. The interconnect structure is electrically connected to the conductive vias.

In another embodiment, the present invention is a method of making a semiconductor device comprising the steps of providing a semiconductor die, depositing an encapsulant around the semiconductor die, mounting a substrate to the semiconductor die, forming a plurality of conductive vias through the substrate and encapsulant, and forming an interconnect structure over a surface of the encapsulant and semiconductor die opposite the substrate. The interconnect structure is electrically connected to the conductive vias.

In another embodiment, the present invention is a semiconductor device comprising a semiconductor die and encapsulant deposited around the semiconductor die. A substrate is mounted to the semiconductor die. A plurality of conductive vias is formed through the substrate and encapsulant. An interconnect structure is formed over a surface of the encapsulant and semiconductor die opposite the substrate. The interconnect structure is electrically connected to the conductive vias.

DETAILED DESCRIPTION OF THE DRAWINGS

Figure 1:
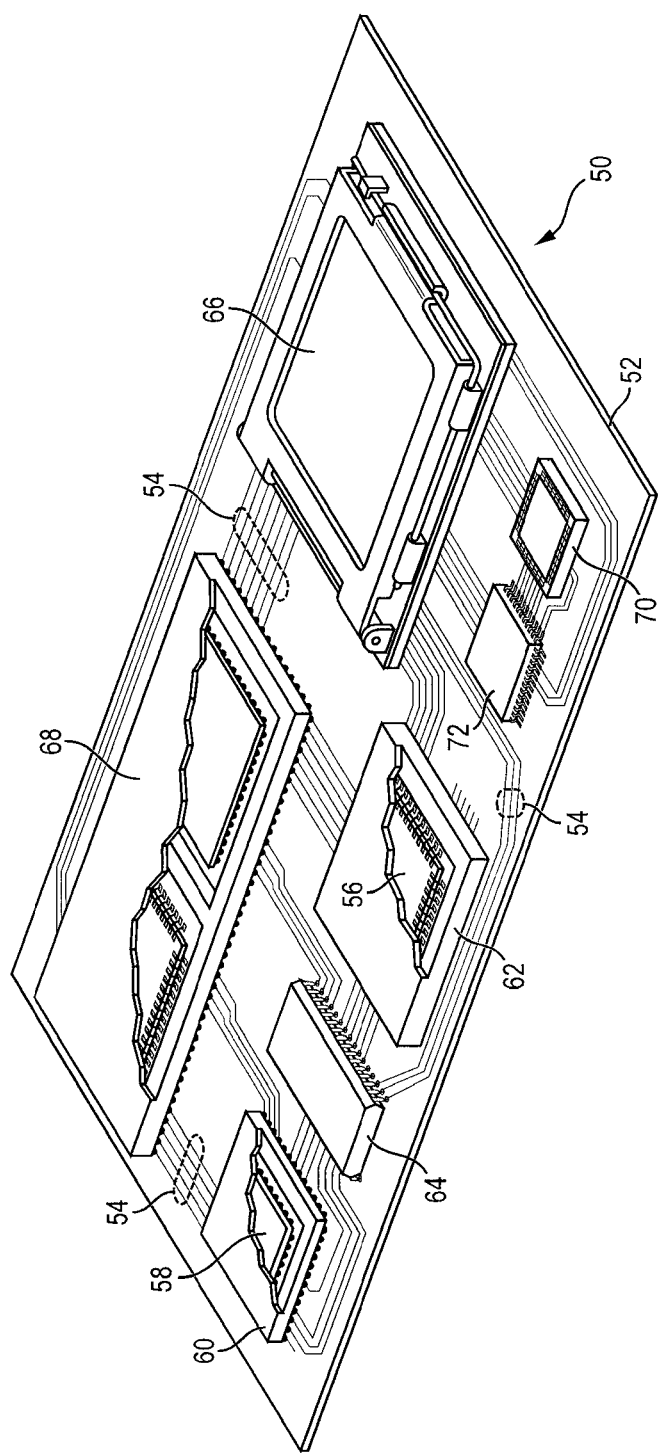
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
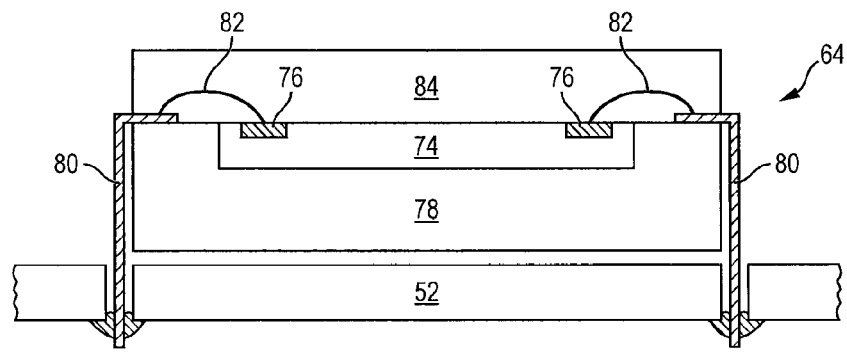
FIGS. 2a-2c illustrate further detail of the representative semiconductor packages mounted to the PCB.
Figure 2B:
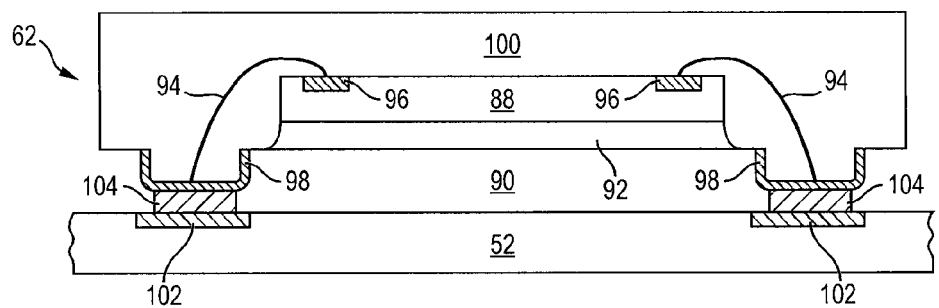
Figure 2C:
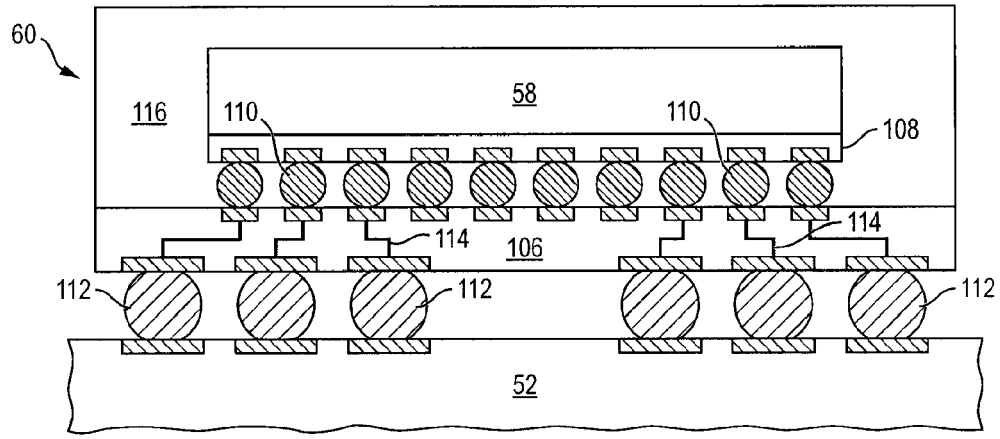

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
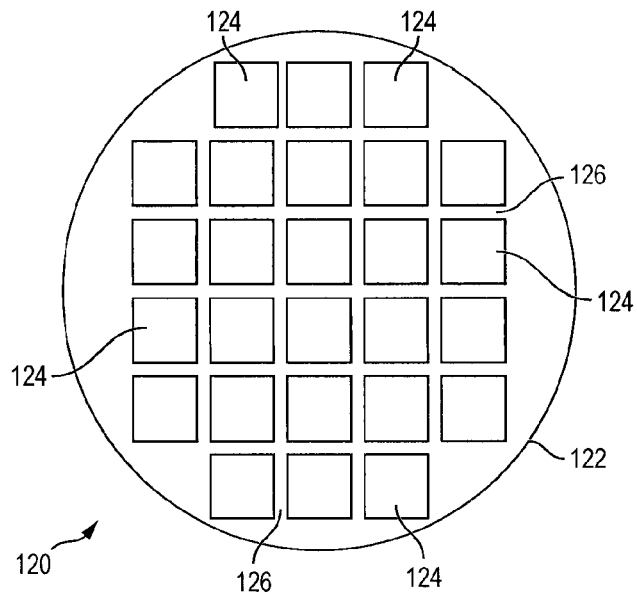
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124. In one embodiment, semiconductor die 124 may have dimensions ranging from 2×2 millimeters (mm) to 15×15 mm.

Figure 3B:
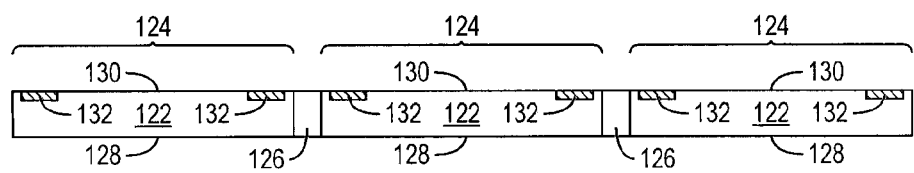

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. Semiconductor die 124 can be a flipchip type die, conductive through silicon vias (TSV) die, or bond wire die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
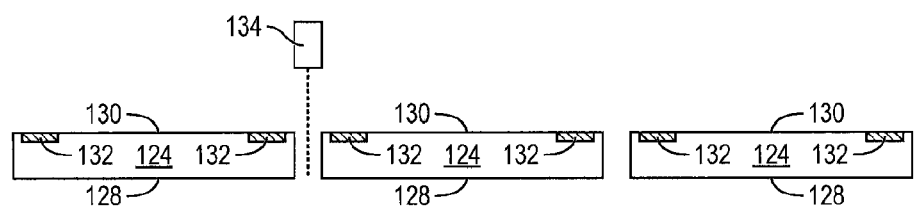

In FIG. 3c, semiconductor wafer 120 is singulated through saw street 126 using a saw blade or laser cutting tool 134 into individual semiconductor die 124.

Figure 4A:
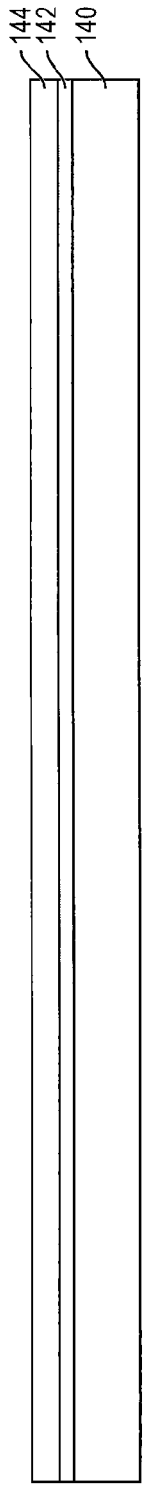
FIGS. 4a-4c illustrate process of forming a wafer-form, strip interposer.
Figure 4B:
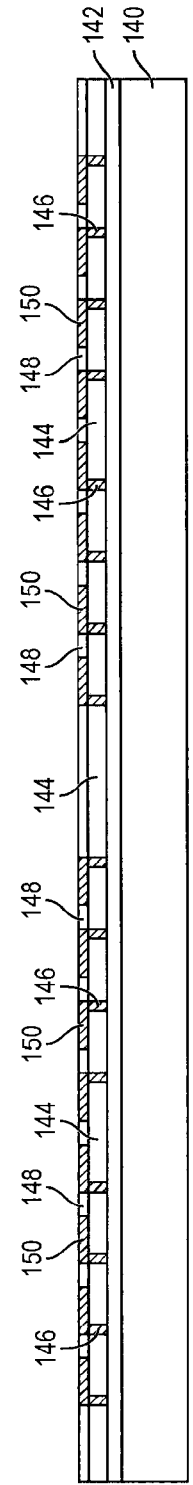
Figure 4C:
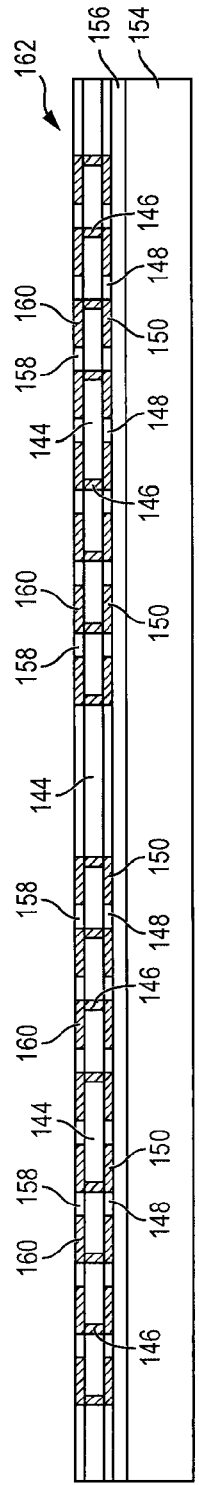

FIG. 4a-4c show formation of a wafer-form, strip leadframe or interposer. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer. A semiconductor wafer or substrate 144 contains a base material, such as silicon, germanium, gallium arsenide, indium phosphide, or silicon carbide, for structural support. As a semiconductor wafer, substrate 144 can contain embedded semiconductor die or passive devices. Substrate 144 can also be a multi-layer flexible laminate, ceramic, or leadframe. Substrate 144 is mounted to interface layer 142 over carrier 140.

In FIG. 4b, a plurality of vias is formed through substrate 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 146.

An insulating or passivation layer 148 is formed over a surface of substrate 144 and conductive vias 146 using PVD, CVD, printing, spin coating, spray coating, sintering or thermal oxidation. The insulating layer 148 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 148 is removed by an etching process to expose substrate 144 and conductive vias 146.

An electrically conductive layer or RDL 150 is formed over the exposed substrate 144 and conductive vias 146 using a patterning and metal deposition process such as printing, PVD, CVD, sputtering, electrolytic plating, and electroless plating. Conductive layer 150 can be one or more layers of Al, Cu, Sn, Ni, Au, Ag, or other suitable electrically conductive material. Conductive layer 150 is electrically connected to conductive vias 146.

In FIG. 4c, a substrate or carrier 154 contains temporary or sacrificial base material such as silicon, polymer, beryllium oxide, or other suitable low-cost, rigid material for structural support. An interface layer or double-sided tape 156 is formed over carrier 154 as a temporary adhesive bonding film or etch-stop layer. Leading with insulating layer 148 and conductive layer 150, substrate 144 is mounted to interface layer 156 over carrier 154. Carrier 140 and interface layer 142 are removed by chemical etching, mechanical peeling, CMP, mechanical grinding, thermal bake, UV light, laser scanning, or wet stripping to expose a surface of substrate 144 and conductive vias 146 opposite conductive layer 150.

An insulating or passivation layer 158 is formed over substrate 144 and conductive vias 146 using PVD, CVD, printing, spin coating, spray coating, sintering or thermal oxidation. The insulating layer 158 contains one or more layers of SiO2, Si3N4, SiON, Ta2O5, Al2O3, or other material having similar insulating and structural properties. A portion of insulating layer 158 is removed by an etching process to expose substrate 144 and conductive vias 146.

An electrically conductive layer or RDL 160 is formed over the exposed substrate 144 and conductive vias 146 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. Conductive layer 160 is electrically connected to conductive vias 146. In another embodiment, conductive vias 146 are formed through substrate 144 after forming conductive layers 150 and/or 160. The resulting wafer-form, strip leadframe or interposer 162 provides electrical interconnect vertically and laterally across the interposer. The interposer 162 can also be an internal stacking module (ISM).

Figure 5A:
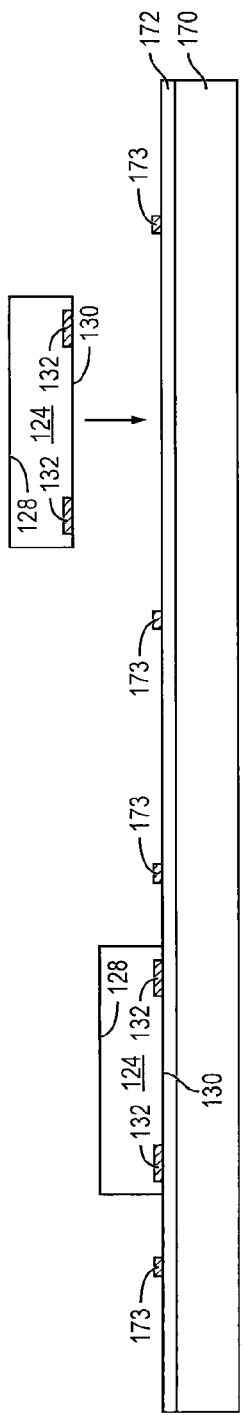
FIGS. 5a-5h illustrate a process of forming an interposer and opposing build-up interconnect structure with connecting conductive TMVs.

FIGS. 5a-5h illustrate, in relation to FIGS. 1 and 2a-2c, a process of forming an interposer and opposing build-up interconnect structure with connecting conductive TMVs for electrical interconnect of a Fo-WLCSP. In FIG. 5a, a substrate or carrier 170 contains temporary or sacrificial base material such as silicon, polymer, beryllium oxide, or other suitable low-cost, rigid material for structural support. An interface layer or double-sided tape 172 is formed over carrier 170 as a temporary adhesive bonding film or etch-stop layer.

Figure 5B:
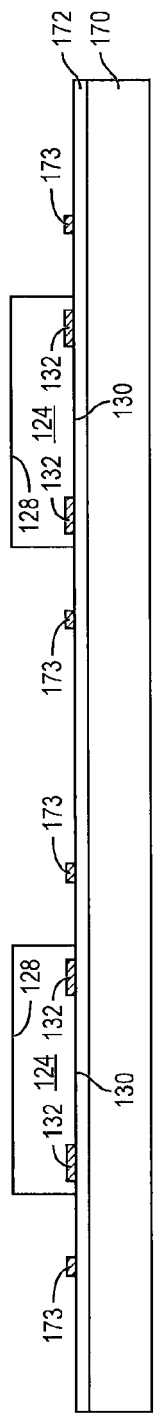

Semiconductor die 124 from FIGS. 3a-3c are mounted to interface layer 172 and carrier 170 using a pick and place operation with active surface 130 oriented toward the carrier. Fiducial alignment marks 173 are formed on carrier 170 to assist alignment, e.g. around edge of the carrier or around each die location. FIG. 5b shows semiconductor die 124 mounted to carrier 170. In another embodiment, an ISM is mounted to carrier 170.

Figure 5C:
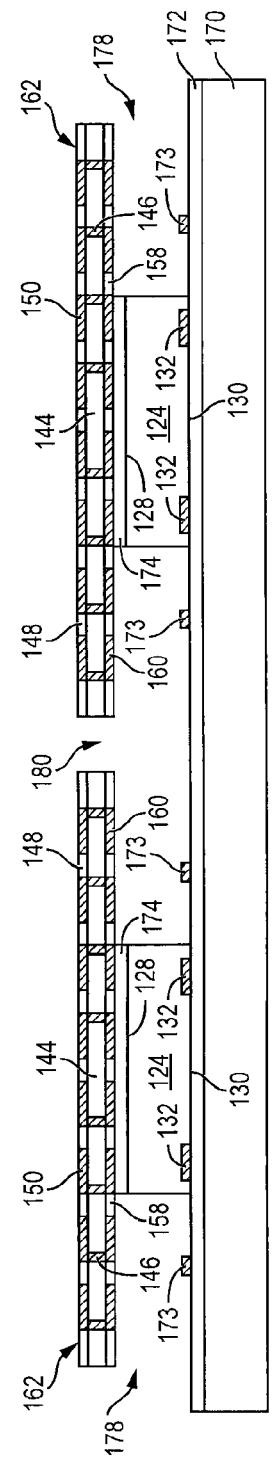

In FIG. 5c, wafer-form, strip leadframe or interposer 162 from FIGS. 4a-4c is mounted to back surface 128 of semiconductor die 124 with die attach adhesive 174, such as epoxy resin.

Figure 5D:
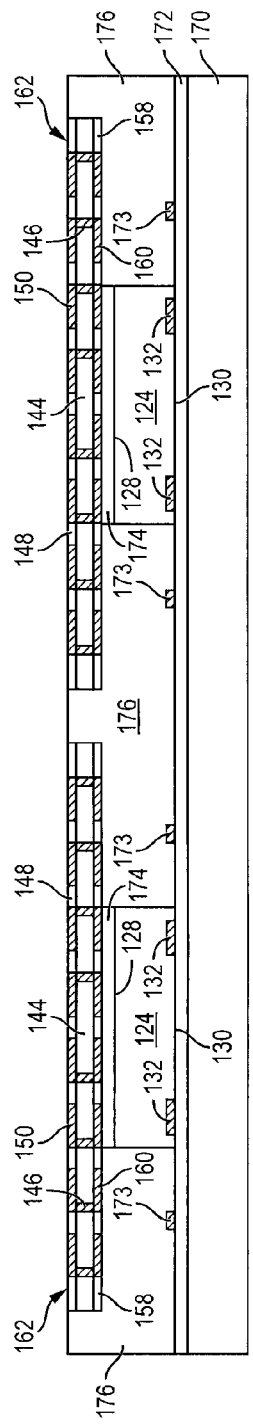

In FIG. 5d, an encapsulant or molding compound 176 is deposited between interposer 162 and carrier 170 around semiconductor die 124 using a paste printing, compressive molding, transfer molding, liquid encapsulant molding, vacuum lamination, spin coating, or other suitable applicator. Encapsulant 176 can be polymer composite material, such as epoxy resin with filler, epoxy acrylate with filler, or polymer with proper filler. Encapsulant 176 can be deposited through side openings 178 between interposer 162 and carrier 170 with vacuum assist. Alternatively, encapsulant 176 is deposited through opening 180 in interposer 162. The viscosity of encapsulant 176 is selected for uniform coverage, e.g. a lower viscosity increases the flow of the encapsulant. Encapsulant 176 is non-conductive and environmentally protects the semiconductor device from external elements and contaminants.

Figure 5E:
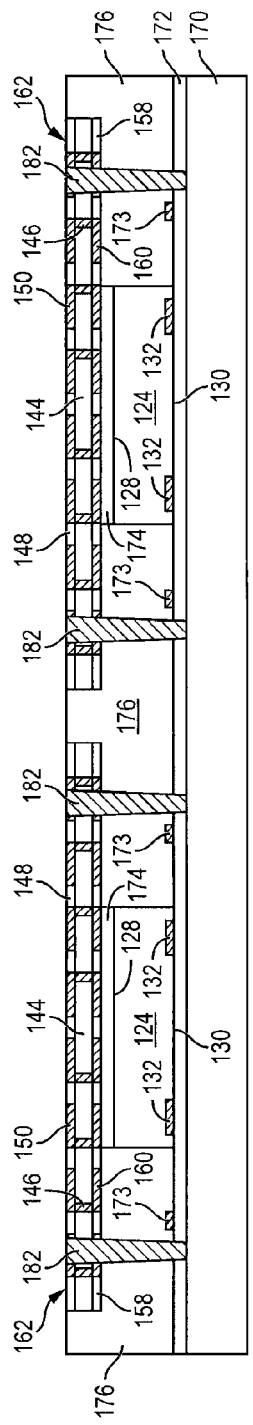

In FIG. 5e, a plurality of vias is formed through interposer 162 and encapsulant 176 using mechanical drilling, laser drilling, or DRIE. The via location can be adjusted to align with conductive layers 150 and 160 of interposer 162. The vias are filled with Al, Cu, Sn, Ni, Au, Ag, Ti, W, poly-silicon, or other suitable electrically conductive material using electrolytic plating, electroless plating process, or other suitable metal deposition process to form z-direction conductive through mold vias (TMV) 182. An optional insulating layer can be formed around conductive TMVs 182. Conductive TMVs 182 extend completely through encapsulant 176 into interface layer 172 or carrier 170. Conductive TMVs 182 are electrically connected to conductive vias 146 and conductive layers 150 and 160 of wafer-form, strip leadframe or interposer 162.

Figure 5F:
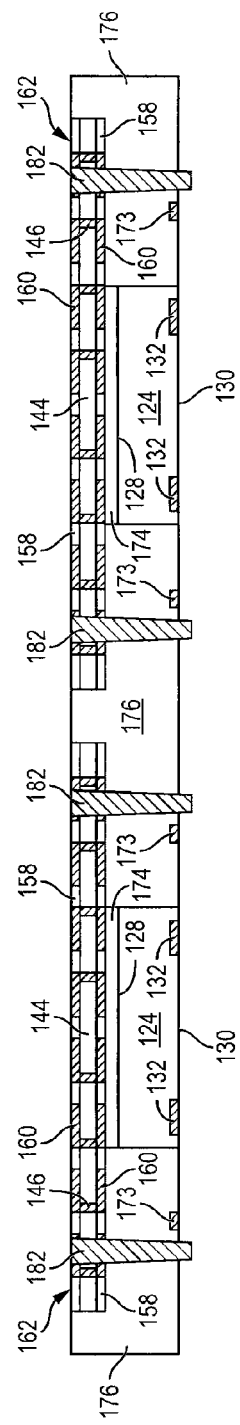

In FIG. 5f, carrier 170 and interface layer 172 are removed by chemical etching, mechanical peeling, CMP, mechanical grinding, thermal bake, UV light, laser scanning, or wet stripping to expose active surface 130, encapsulant 176, and conductive TMVs 182. Since conductive TMVs 182 extend completely through encapsulant 176 to carrier 170, the conductive TMVs are exposed and protrude from encapsulant 176 following removal of the carrier.

Figure 5G:
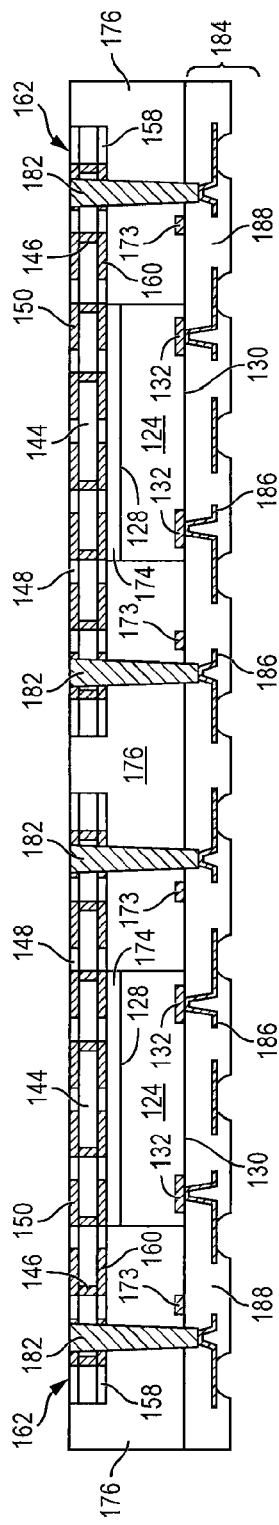

In FIG. 5g, a build-up interconnect structure 184 is formed over semiconductor die 124, encapsulant 176, and conductive TMVs 182. The build-up interconnect structure 184 includes an electrically conductive layer or RDL 186 formed using a patterning and metal deposition process such as sputtering, electrolytic plating, and electroless plating. Conductive layer 186 can be one or more layers of Al, Cu, Sn, Ni, Au, Ag, or other suitable electrically conductive material. The protruding conductive TMVs 182 assist with formation of build-up interconnect structure 184 by aligning conductive layer 186 with the protruding conductive TMVs. One portion of conductive layer 186 is electrically connected to contact pads 132 of semiconductor die 124. Another portion of conductive layer 186 is electrically connected to conductive TMVs 182. Other portions of conductive layer 186 can be electrically common or electrically isolated depending on the design and function of semiconductor die 124.

An insulating or passivation layer 188 is formed between conductive layer 186 for electrical isolation using PVD, CVD, printing, spin coating, spray coating, sintering or thermal oxidation. The insulating layer 188 contains one or more layers of SiO2, Si3N4, SiON, Ta2O5, Al2O3, or other material having similar insulating and structural properties. A portion of insulating layer 188 can be removed by an etching process to expose conductive layer 186 for bump formation or additional package interconnect. The build-up interconnect structure 184 is electrically connected to interposer 162 by way of conductive TMVs 182.

Figure 5H:
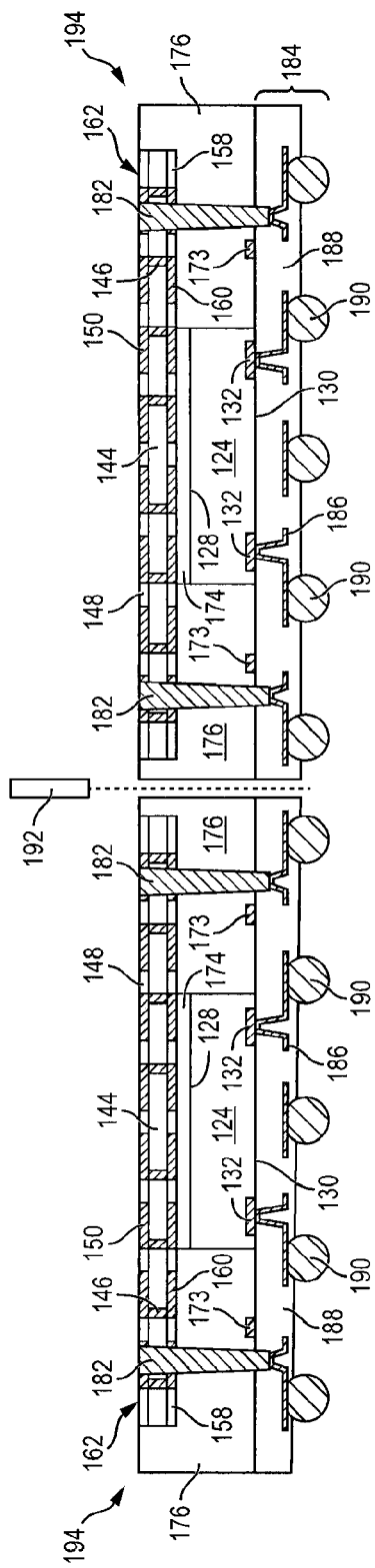

In FIG. 5h, an electrically conductive bump material is deposited over build-up interconnect structure 184 and electrically connected to the exposed portion of conductive layer 186 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 186 using a suitable attachment or bonding process. In one embodiment, the bump material is reflowed by heating the material above its melting point to form spherical balls or bumps 190. In some applications, bumps 190 are reflowed a second time to improve electrical contact to conductive layer 186. An under bump metallization (UBM) layer can be formed under bumps 190. The bumps can also be compression bonded to conductive layer 186. Bumps 190 represent one type of interconnect structure that can be formed over conductive layer 186. The interconnect structure can also use stud bump, micro bump, or other electrical interconnect.

Figure 6:
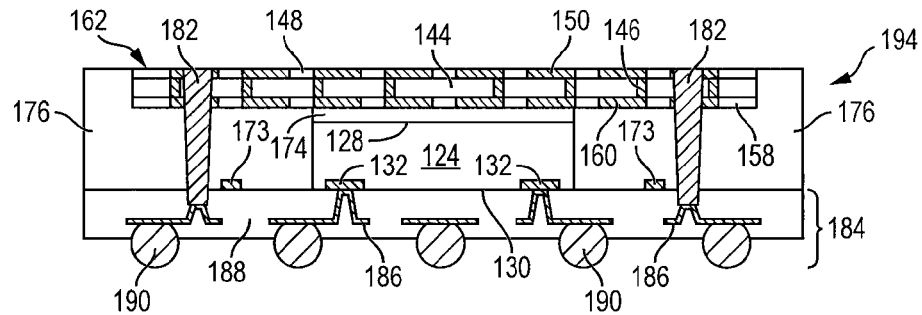
FIG. 6 illustrates the Fo-WLCSP having the interposer and opposing build-up interconnect structure with connecting conductive TMVs for electrical interconnect.

Semiconductor die 124 are singulated through encapsulant 164 with saw blade or laser cutting tool 192 into individual Fo-WLCSP 194, as shown in FIG. 6. Semiconductor die 124 is electrically connected through contact pads 132, build-up interconnect structure 184, and conductive TMVs 182 to interposer 162. The wafer-form, strip leadframe or interposer 162 and opposing build-up interconnect structure 184 with connecting conductive TMVs 182 provide a simple and cost effective structure for vertical interconnect of semiconductor die 124, as well as efficient package stacking through the wiring layer of the interposer and build-up interconnect structure 184.

Figure 7:
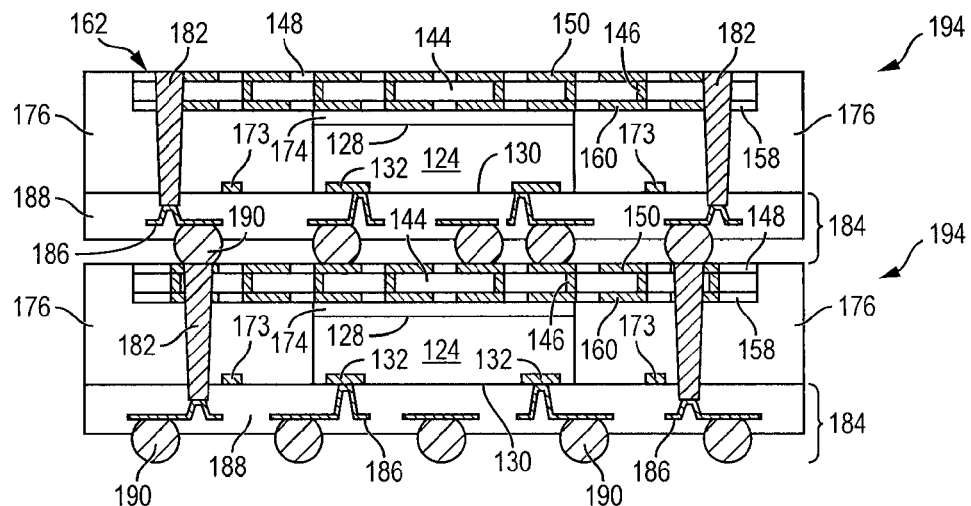
FIG. 7 illustrates two stacked Fo-WLCSP having the interposer and opposing build-up interconnect structure with connecting conductive TMVs for electrical interconnect.

FIG. 7 shows two stacked Fo-WLCSP 194. Semiconductor die 124 of each Fo-WLCSP 194 are electrically connected through build-up interconnect structure 184, bumps 190, conductive TMVs 182, and interposer 162.

Figure 8:
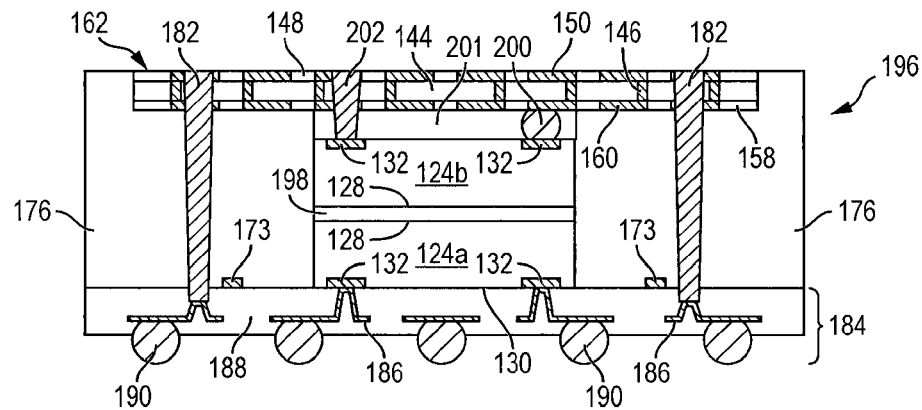
FIG. 8 illustrates two stacked semiconductor die within the Fo-WLCSP.

FIG. 8 shows an embodiment of Fo-WLCSP 196, similar to FIG. 6, with stacked semiconductor die 124 having similar or different electrical functions. Semiconductor die 124a is mounted back surface-to-back surface of semiconductor die 124b with die attach adhesive 198. The interposer 162 is mounted to semiconductor die 124b with die attach adhesive 201. Contact pads 132 of semiconductor die 124b can be electrically connected to conductive layer 150 and 160 of interposer 162 with bump 200 or conductive vias 202. Semiconductor die 124a and 124b are electrically connected by way of build-up interconnect structure 184, conductive TMVs 182, and interposer 162.

Figure 9A:
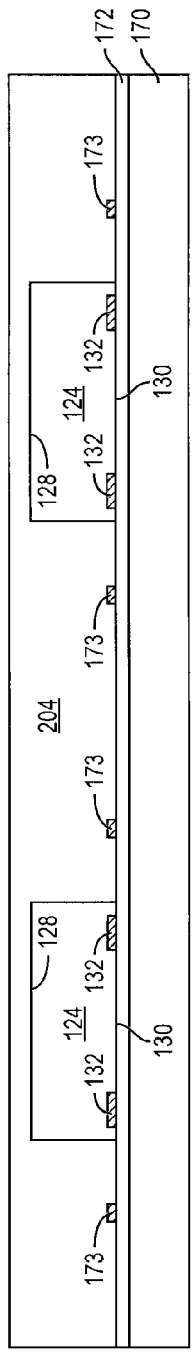
FIGS. 9a-9g illustrate another process of forming an interposer and opposing build-up interconnect structure with connecting conductive TMVs.

FIGS. 9a-9g illustrate, in relation to FIGS. 1 and 2a-2c, another process of forming an interposer and opposing build-up interconnect structure with connecting conductive TMVs for electrical interconnect of a Fo-WLCSP. Continuing from FIG. 5b, an encapsulant or molding compound 204 deposited over carrier 170 around semiconductor die 124 using a paste printing, compressive molding, transfer molding, liquid encapsulant molding, vacuum lamination, spin coating, or other suitable applicator, as shown in FIG. 9a. Encapsulant 204 can be polymer composite material, such as epoxy resin with filler, epoxy acrylate with filler, or polymer with proper filler. Encapsulant 204 is non-conductive and environmentally protects the semiconductor device from external elements and contaminants.

Figure 9B:
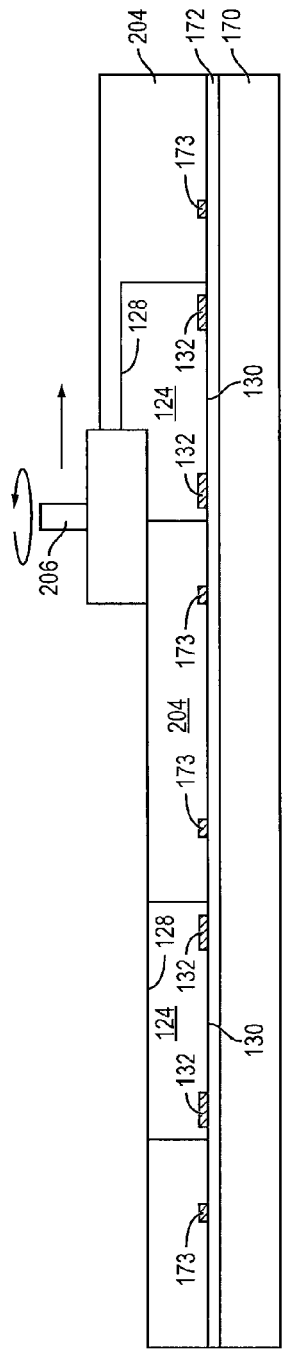

In FIG. 9b, a portion of encapsulant 204 is removed by grinder 206 to planarize the encapsulant. The grinding operation can also remove bulk semiconductor material from back surface 128 of semiconductor die 124 for a thinner package profile.

Figure 9C:
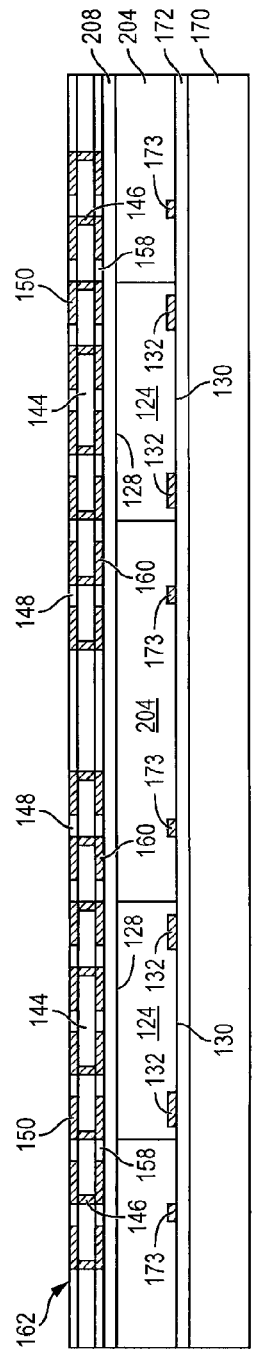

In FIG. 9c, wafer-form, strip leadframe or interposer 162 is mounted to the back surface of semiconductor die 124 and encapsulant 204 with die attach adhesive 208, such as epoxy resin.

Figure 9D:
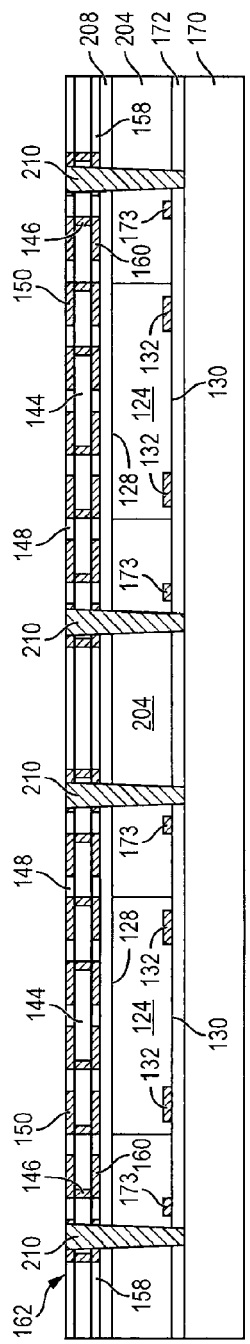

In FIG. 9d, a plurality of vias is formed through interposer 162 and encapsulant 204 using mechanical drilling, laser drilling, or DRIE. The via location can be adjusted to align with conductive layers 150 and 160 of interposer 162. The vias are filled with Al, Cu, Sn, Ni, Au, Ag, Ti, W, poly-silicon, or other suitable electrically conductive material using electrolytic plating, electroless plating process, or other suitable metal deposition process to form z-direction conductive TMVs 210. An optional insulating layer can be formed around conductive TMVs 210. Conductive TMVs 210 extend completely through encapsulant 204 into interface layer 172 or carrier 170. Conductive TMVs 210 are electrically connected to conductive vias 146 and conductive layers 150 and 160 of wafer-form, strip leadframe or interposer 162.

Figure 9E:
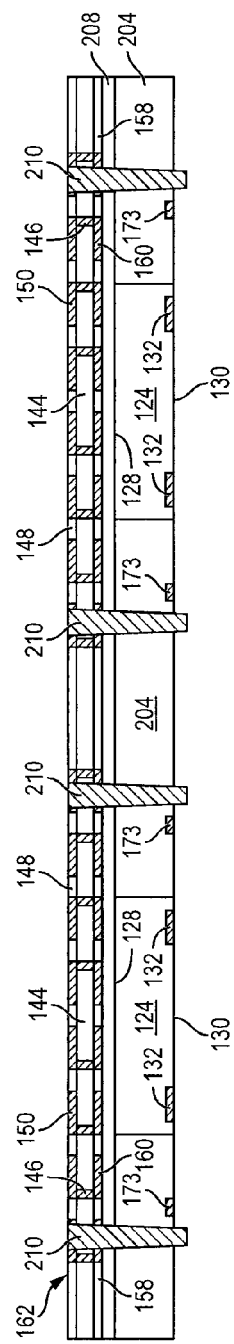

In FIG. 9e, carrier 170 and interface layer 172 are removed by chemical etching, mechanical peeling, CMP, mechanical grinding, thermal bake, UV light, laser scanning, or wet stripping to expose active surface 130, encapsulant 204, and conductive TMVs 210. Since conductive TMVs 210 extend completely through encapsulant 204 into carrier 170, the conductive TMVs are exposed and protrude from encapsulant 204 following removal the carrier.

Figure 9F:
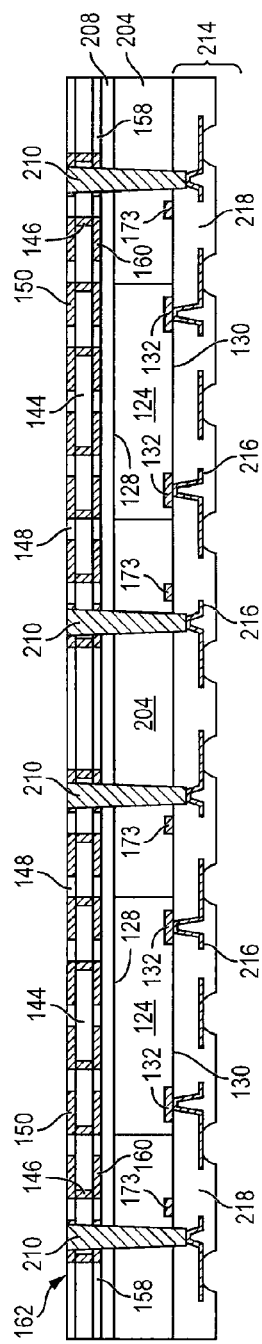

In FIG. 9f, a build-up interconnect structure 214 is formed over semiconductor die 124, encapsulant 204, and conductive TMVs 210. The build-up interconnect structure 214 includes an electrically conductive layer or RDL 216 formed using a patterning and metal deposition process such as sputtering, electrolytic plating, and electroless plating. Conductive layer 216 can be one or more layers of Al, Cu, Sn, Ni, Au, Ag, or other suitable electrically conductive material. The protruding conductive TMVs 210 assist with formation of build-up interconnect structure 214 by aligning conductive layer 216 with the exposed conductive TMVs. One portion of conductive layer 216 is electrically connected to contact pads 132 of semiconductor die 124. Another portion of conductive layer 216 is electrically connected to conductive TMVs 210. Other portions of conductive layer 216 can be electrically common or electrically isolated depending on the design and function of semiconductor die 124.

An insulating or passivation layer 218 is formed between conductive layer 216 for electrical isolation using PVD, CVD, printing, spin coating, spray coating, sintering or thermal oxidation. The insulating layer 218 contains one or more layers of SiO2, Si3N4, SiON, Ta2O5, Al2O3, or other material having similar insulating and structural properties. A portion of insulating layer 218 can be removed by an etching process to expose conductive layer 216 for bump formation or additional package interconnect. The build-up interconnect structure 214 is electrically connected to interposer 162 by way of conductive TMVs 210.

Figure 9G:
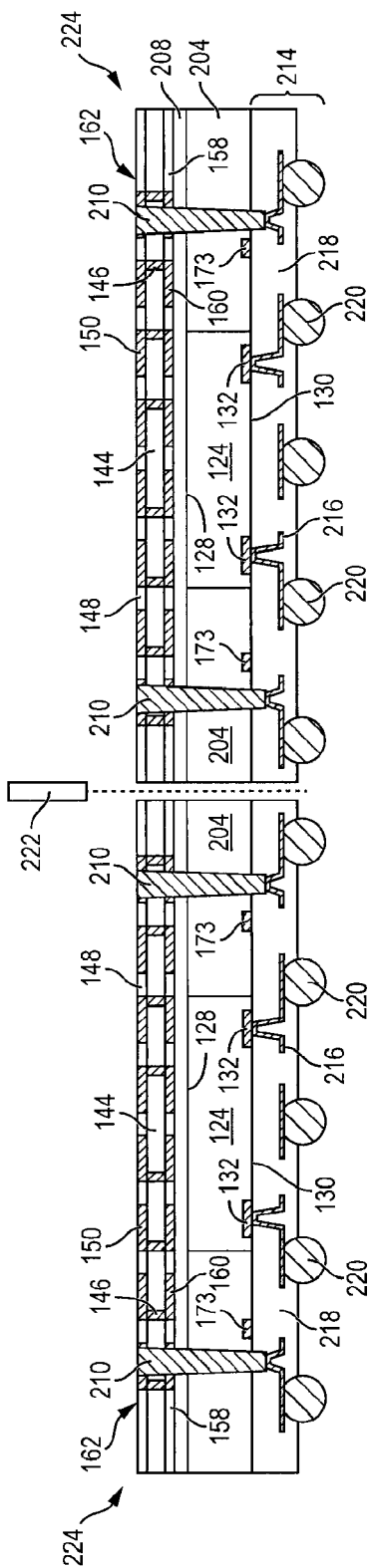

In FIG. 9g, an electrically conductive bump material is deposited over build-up interconnect structure 214 and electrically connected to the exposed portion of conductive layer 216 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 216 using a suitable attachment or bonding process. In one embodiment, the bump material is reflowed by heating the material above its melting point to form spherical balls or bumps 220. In some applications, bumps 220 are reflowed a second time to improve electrical contact to conductive layer 216. A UBM layer can be formed under bumps 220. The bumps can also be compression bonded to conductive layer 216. Bumps 220 represent one type of interconnect structure that can be formed over conductive layer 216. The interconnect structure can also use stud bump, micro bump, or other electrical interconnect.

Figure 10:
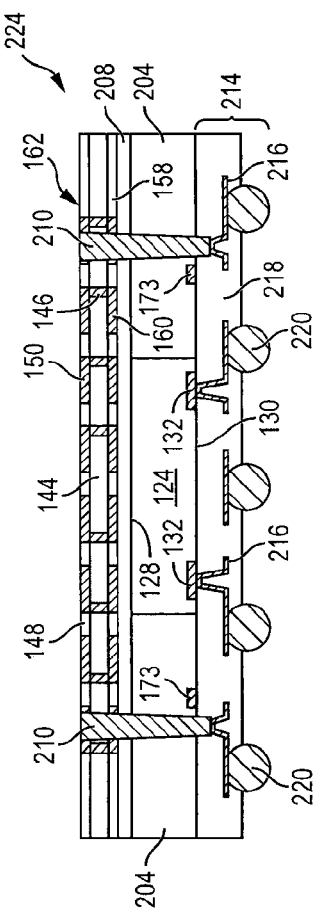
FIG. 10 illustrates the Fo-WLCSP having the alternate interposer and opposing build-up interconnect structure with connecting conductive TMVs for electrical interconnect.

Semiconductor die 124 are singulated through encapsulant 204 with saw blade or laser cutting tool 222 into individual Fo-WLCSP 224, as shown in FIG. 10. Semiconductor die 124 is electrically connected through contact pads 132, build-up interconnect structure 214, and conductive TMVs 210 to interposer 162. The wafer-form, strip leadframe or interposer 162 and opposing build-up interconnect structure 214 with connecting conductive TMVs 210 provide a simple and cost effective structure for vertical interconnect of semiconductor die 124, as well as efficient package stacking through the wiring layer of the interposer and build-up interconnect structure 214.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate including a plurality of first conductive vias formed through the substrate and a first conductive layer formed over the substrate;
    providing a carrier;
    mounting a semiconductor die over the carrier;
    mounting the substrate to the semiconductor die opposite the carrier;
    depositing an encapsulant between the substrate and carrier around the semiconductor die;
    forming a plurality of second conductive vias through the substrate and encapsulant, the second conductive vias being electrically connected to the first conductive layer and first conductive vias;
    removing the carrier to expose a surface of the second conductive vias; and
    forming an interconnect structure over a surface of the encapsulant and semiconductor die opposite the substrate, the interconnect structure being electrically connected to the second conductive vias.

2. The method of claim 1, wherein the second conductive vias protrude from the encapsulant.

3. The method of claim 1, further including providing a plurality of alignment marks over the carrier to aid with mounting the semiconductor die.

4. The method of claim 1, further including:
    stacking a plurality of semiconductor devices; and
    electrically connecting the semiconductor devices through the substrate, second conductive vias, and interconnect structure.

5. The method of claim 1, further including stacking a plurality of semiconductor dies between the substrate and interconnect structure.

6. The method of claim 1, wherein forming the interconnect structure includes:
    forming a second conductive layer over the surface of the encapsulant and semiconductor die opposite the substrate; and
    forming an insulating layer around the second conductive layer.

7. A method of making a semiconductor device, comprising:
    providing a substrate having a conductive path through the substrate;
    providing a semiconductor die;
    mounting the substrate to the semiconductor die;
    depositing an encapsulant around the semiconductor die;

forming a plurality of conductive vias through the substrate and encapsulant, the conductive vias being electrically connected to the conductive path through the substrate; and forming an interconnect structure over a surface of the encapsulant and semiconductor die opposite the substrate, the interconnect structure being electrically connected to the conductive vias, wherein forming the interconnect structure includes, forming a conductive layer over the surface of the encapsulant and semiconductor die opposite the substrate, and forming an insulating layer around the conductive layer.

8. The method of claim 7, wherein the conductive vias protrude from the encapsulant.

9. The method of claim 7, further including aligning the interconnect structure to the conductive vias.

10. The method of claim 7, further including:
stacking a plurality of semiconductor devices; and
electrically connecting the semiconductor devices through the substrate, conductive vias, and interconnect structure.

11. The method of claim 7, further including stacking a plurality of semiconductor dies between the substrate and interconnect structure.

12. The method of claim 7, further including depositing the encapsulant around the semiconductor die through an opening in the substrate.

13. A method of making a semiconductor device, comprising:
providing a semiconductor die;
mounting a substrate to the semiconductor die;
depositing an encapsulant around the semiconductor die through an opening in the substrate;
forming a plurality of conductive vias through the substrate and encapsulant; and
forming an interconnect structure over a surface of the encapsulant and semiconductor die opposite the substrate, the interconnect structure being electrically connected to the conductive vias.

14. The method of claim 13, wherein the conductive vias protrude from the encapsulant.

15. The method of claim 13, further including aligning the interconnect structure to the conductive vias.

16. The method of claim 13, further including removing a portion of the semiconductor die prior to mounting the substrate.

17. The method of claim 13, further including:
stacking a plurality of semiconductor devices; and
electrically connecting the semiconductor devices through the substrate, conductive vias, and interconnect structure.

18. The method of claim 13, further including stacking a plurality of semiconductor dies between the substrate and interconnect structure.

19. A method of making a semiconductor device, comprising:
providing a first semiconductor die including an active surface and a back surface opposite the active surface;
mounting a substrate over the back surface of the first semiconductor die;
disposing an encapsulant around the first semiconductor die;
forming a first interconnect structure through the substrate and encapsulant;
forming a conductive layer over the encapsulant and active surface of the first semiconductor die; and
removing a portion of the first semiconductor die after disposing the encapsulant.

20. The method of claim 19, further including:
stacking a plurality of semiconductor devices; and
electrically connecting the semiconductor devices through the substrate, first interconnect structure, and conductive layer.

21. The method of claim 19, further including:
disposing a second semiconductor die between the first semiconductor die and the substrate; and
forming a second interconnect structure between the substrate and second semiconductor die.

22. The method of claim 19, further including:
providing one or more alignment marks;
mounting the substrate aligned to the alignment marks; and
disposing the encapsulant around the alignment marks.

23. The method of claim 19, further including forming the conductive layer aligned to the first interconnect structure.

* * * * *